(12) United States Patent
Tanioka et al.

(10) Patent No.: US 9,935,170 B2
(45) Date of Patent: Apr. 3, 2018

(54) SILICON CARBIDE SEMICONDUCTOR DEVICE AND METHOD FOR MANUFACTURING SAME

(71) Applicant: Mitsubishi Electric Corporation, Tokyo (JP)

(72) Inventors: Toshikazu Tanioka, Tokyo (JP); Yoichiro Tarui, Tokyo (JP); Masayuki Furuhashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/504,582

(22) PCT Filed: Nov. 6, 2014

(86) PCT No.: PCT/JP2014/079452
§ 371 (c)(1),
(2) Date: Feb. 16, 2017

(87) PCT Pub. No.: WO2016/071990
PCT Pub. Date: May 12, 2016

(65) Prior Publication Data
US 2017/0250254 A1     Aug. 31, 2017

(51) Int. Cl.
*H01L 29/16*       (2006.01)
*H01L 29/167*     (2006.01)
(Continued)

(52) U.S. Cl.
CPC .... *H01L 29/1608* (2013.01); *H01L 21/02529* (2013.01); *H01L 21/049* (2013.01);
(Continued)

(58) Field of Classification Search
CPC ........... H01L 29/1608; H01L 29/66712; H01L 29/7802; H01L 29/66068; H01L 21/049;
(Continued)

(56) References Cited

U.S. PATENT DOCUMENTS

| 7,338,869 B2 | 3/2008 | Fukuda et al. |
| 7,671,409 B2 | 3/2010 | Kitabatake et al. |

(Continued)

FOREIGN PATENT DOCUMENTS

| JP | 2005-223003 A | 8/2005 |
| JP | 2009-509338 A | 3/2009 |

(Continued)

OTHER PUBLICATIONS

An Office Action; "Notice of Reasons for Rejection," mailed by the Japanese Patent Office dated Oct. 24, 2017, which corresponds to Japanese Patent Application No. 2016-557399 and is related to U.S. Appl. No. 15/504,582 ; with English language translation.

(Continued)

*Primary Examiner* — Michael Carter
*Assistant Examiner* — Mohammed R Alam
(74) *Attorney, Agent, or Firm* — Studebaker & Brackett PC (57) ABSTRACT

A silicon carbide semiconductor device can switch between an on-state and an off-state by controlling a channel region with an application of a gate voltage. The silicon carbide semiconductor device includes a silicon carbide layer, a gate insulating film, and a gate electrode. The silicon carbide layer includes a channel region. The gate insulating film covers the channel region. The gate electrode faces the channel region with the gate insulating film therebetween. The resistance of the channel region in the on-state takes a minimum value at a temperature of not less than 100° C. and not more than 150° C.

6 Claims, 8 Drawing Sheets

(51) Int. Cl.
*H01L 21/324* (2006.01)
*H01L 21/04* (2006.01)
*H01L 21/02* (2006.01)
*H01L 29/66* (2006.01)
*H01L 29/78* (2006.01)

(52) U.S. Cl.
CPC .......... *H01L 21/324* (2013.01); *H01L 29/167* (2013.01); *H01L 29/66068* (2013.01); *H01L 29/66712* (2013.01); *H01L 29/7802* (2013.01)

(58) Field of Classification Search
CPC ................ H01L 21/324; H01L 29/167; H01L 21/02529; H01L 21/0445; H01L 21/322; H01L 29/7395; H01L 29/16; H01L 29/7325; C30B 29/36; C30B 31/22
See application file for complete search history.

(56) References Cited

U.S. PATENT DOCUMENTS

| | | | |
|---|---|---|---|
| 7,727,904 B2 | 6/2010 | Das et al. | |
| 8,536,066 B2 | 9/2013 | Das et al. | |
| 8,846,531 B2 | 9/2014 | Tamaso et al. | |
| 9,184,229 B2 | 11/2015 | Ota et al. | |
| 9,515,145 B2 | 12/2016 | Furuhashi et al. | |
| 2008/0265260 A1* | 10/2008 | Kitabatake | H01L 29/7828 257/77 |
| 2012/0056195 A1* | 3/2012 | Kono | H01L 29/1033 257/77 |
| 2012/0129343 A1 | 5/2012 | Tamaso et al. | |
| 2012/0286291 A1 | 11/2012 | Hiyoshi et al. | |
| 2012/0315770 A1 | 12/2012 | Nakashima et al. | |
| 2014/0034965 A1 | 2/2014 | Ota et al. | |
| 2015/0380494 A1* | 12/2015 | Furuhashi | H01L 29/78 257/77 |

FOREIGN PATENT DOCUMENTS

| | | |
|---|---|---|
| JP | 2009-224797 A | 10/2009 |
| JP | 2011-082254 A | 4/2011 |
| JP | 2011-091186 A | 5/2011 |
| JP | 2012-256774 A | 12/2012 |
| JP | 2013-247141 A | 12/2013 |
| JP | 2014-045167 A | 3/2014 |
| WO | 2005/122273 A1 | 12/2005 |
| WO | 2007/035304 A1 | 3/2007 |
| WO | 2011/111627 A1 | 9/2011 |
| WO | 2014/132582 A1 | 9/2014 |

OTHER PUBLICATIONS

International Search Report issued in PCT/JP2014/079452; dated Feb. 10, 2015.
Niwayama et al.; SiC Power Device and Loss-Reduction Operation; Panasonic Technical Journal; Apr. 2011; pp. 9-14; vol. 57 No. 1.
Notification of Transmittal of Translation of the International Preliminary Report on Patentability (Chapter I) and Translation of Written Opinion of the International Searching Authority; PCT/JP2014/079452; dated May 18, 2017.
An Office Action; "Notice of Reasons for Rejection," mailed by the Japanese Patent Office dated Jul. 4, 2017, which corresponds to Japanese Patent Application No. 2016-557399 and is related to U.S. Appl. No. 15/504,582; with English Translation.

* cited by examiner

F I G. 1 3

SILICON CARBIDE SEMICONDUCTOR DEVICE AND METHOD FOR MANUFACTURING SAME

TECHNICAL FIELD

The present invention relates to a silicon carbide semiconductor device and a manufacturing method thereof, and more particularly, to a silicon carbide semiconductor device and a manufacturing method thereof capable of switching between an on-state and an off-state by controlling a channel region with an application of a gate voltage.

BACKGROUND ART

An increase in a power density or a simplification of a cooling system is considered to further downsize an inverter. It is therefore expected that the inverter needs to be kept constantly operated in a high-temperature environment of not less than 100° C. and not more than 150° C. in the future. A silicon carbide semiconductor device, which is a semiconductor device using a silicon carbide (SiC) layer as a semiconductor layer is appropriate for a high-temperature operation and is expected to satisfy the above demand.

The inverter normally has a switching element such as a MOSFET (Metal Oxide Semiconductor Field Effect Transistor) or an IGBT (Insulated Gate Bipolar Transistor), for example. The inverter increases in temperature from a room temperature in accordance with the operation of the switching element. Masahiko Niwayama and the other three describes in "SiC Power Device and Loss-Reduction Operation", Panasonic Technical Journal, April 2011, Vol. 57, No: 1, pp. 9-14 (non-patent document 1) that a temperature dependence of an on-resistance of a SiC-MOSFET is rendered negative at a temperature equal to or lower than the room temperature and rendered positive at a temperature equal to or higher than the room temperature. In accordance with the above journal, the temperature dependence occurs by a reduction in a channel resistance of MOS and an increase in a drift resistance associated with a temperature increase.

In the SiC-MOSFET, the channel resistance in the on-resistance particularly causes a problem at present. It is considered that a reason why the channel resistance particularly increases at a time of using SiC instead of Si is that an interface state density is high at an interface between an oxide film and a SiC layer in a MOSFET structure, so that a channel mobility is extremely small compared with an electron mobility in a bulk. Accordingly, lowering of the interface state is regarded as important as described in Japanese Patent Application Laid-Open No. 2009-224797 (Patent Document 1), for example.

PRIOR ART DOCUMENTS

Patent Documents

[Patent Document 1]: Japanese Patent Application Laid-Open No. 2009-224797

Non-Patent Documents

[Non-Patent Document 1]: Panasonic Technical Journal, April 2011, Vol. 57, No. 1, pp. 9 to 14

SUMMARY OF THE INVENTION

Problems to be Solved by the Invention

As described in the above journal, the on-resistance particularly increases in the high-temperature environment. In accordance with a review of the inventor of the present invention, it is difficult to drastically reduce the on-resistance in the high-temperature environment even when a manufacturing condition of the SiC-MOSFET is adjusted with emphasis of the reduction in the interface state density as described in the above journal in order to improve the problem.

The present invention has been achieved to solve problems as described above, and it is an object of the present invention to provide a silicon carbide semiconductor device and a manufacturing method thereof capable of reducing an on-resistance in particularly a high-temperature environment.

Means for Solving the Problems

A silicon carbide semiconductor device of the present invention can switch between an on-state and an off-state by controlling a channel region with an application of a gate voltage, and includes a silicon carbide layer, a gate insulating film, and a gate electrode. The silicon carbide layer includes a channel region. The gate insulating film covers the channel region of the silicon carbide layer. The gate electrode faces the channel region of the silicon carbide layer with the gate insulating film therebetween. The resistance of the channel region in the on-state takes a minimum value at a temperature of not less than 100° C. and not more than 150° C.

A manufacturing method of a silicon carbide semiconductor device of the present invention is a manufacturing method of a silicon carbide semiconductor device which can switch between an on-state and an off-state by controlling a channel region with an application of a gate voltage. The present manufacturing method includes steps of forming a silicon carbide layer having the channel region, forming a gate insulating film for covering the channel region of the silicon carbide layer, and forming a gate electrode which faces the channel region of the silicon carbide layer with the gate insulating film therebetween. The step of forming the gate insulating film includes steps of forming an oxide film which covers the channel region, performing a first thermal treatment for reducing an interface state density of the channel region in a nitriding atmosphere after the step of forming the oxide film, and performing a second thermal treatment for increasing the interface state density of the channel region in an oxidizing atmosphere after the step of performing the first thermal treatment.

Effects of the Invention

According to the silicon carbide semiconductor device of the present invention, the channel resistance takes a minimum value in a high temperature environment of not less than 100° C. and not more than 150° C., which is considered to be useful as an operation temperature. Accordingly, the on-resistance, in which the channel resistance makes up a large portion, of the silicon carbide semiconductor device can be decreased particularly in the high temperature environment.

According to the method of manufacturing the silicon carbide semiconductor device of the present invention, the channel resistance is decreased by the decrease in the interface state density caused by the first thermal treatment, and moreover, the channel resistance is adjusted to take the minimum value in the high temperature environment by the second thermal treatment. Accordingly, the on-resistance, in which the channel resistance makes up the large portion, of the silicon carbide semiconductor device can be decreased particularly in the high temperature environment.

EMBODIMENTS FOR IMPLEMENTING THE INVENTION

An embodiment of the present invention is described based on drawings hereinafter. The same or corresponding components as those described in the following drawings are denoted by the same references numbers, which are not described repeatedly.

Embodiment 1

<Structure>

Figure 1:
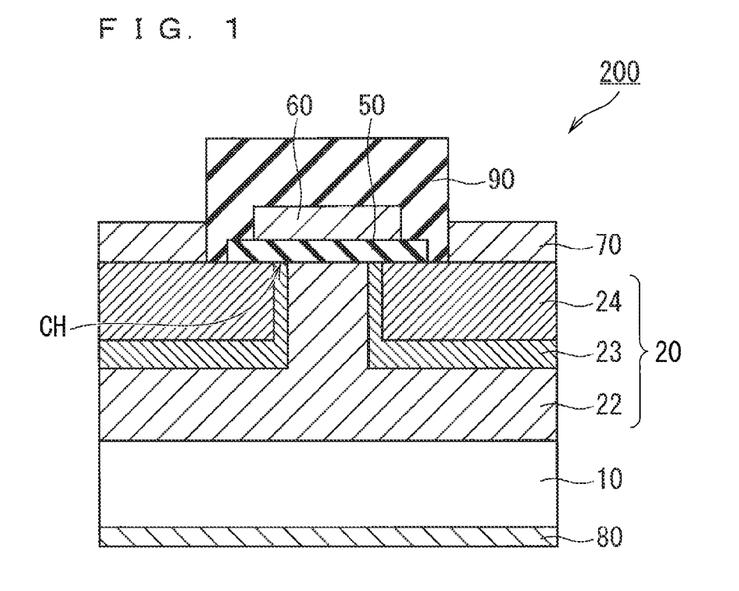
FIG. 1 A sectional view schematically showing a configuration of a silicon carbide semiconductor device in an embodiment 1 of the present invention.

With reference to FIG. 1, a MOSFET 200 (a silicon carbide semiconductor device) of the present embodiment is a switching element capable of switching between an on-state and an off-state by controlling a channel region CH with an application of a gate voltage. The MOSFET 200 is a vertical semiconductor device, that is to say, a device including a current pathway in a thickness direction of a substrate. The MOSFET 200 is a planar semiconductor device, that is to say, a device including a gate electrode parallel to a surface of the substrate. The MOSFET 200 includes a single-crystal substrate 10, a SiC layer 20 (a silicon carbide layer), a gate insulating film 50, a gate electrode 60, a source electrode 70, a drain electrode 80, and an interlayer insulating film 90.

The single-crystal substrate 10 is an n-type. The single-crystal substrate 10 is made of SiC having polytype 4H. The single-crystal substrate 10 includes a (0001) plane as a main surface (an upper surface in FIG. 1).

The SiC layer 20 is an epitaxial layer provided on the main surface of the single-crystal substrate 10. Accordingly, the SiC epitaxial substrate is made up of the single-crystal substrate 10 and the SiC layer 20. A thickness of the SiC layer 20 is 5 to 50 μm, for example. The SiC layer 20 includes a drift layer 22, a base region 23, and a source region 24.

The drift layer 22 is provided on the single-crystal substrate 10. The drift layer 22 is an n-type. An impurity concentration of the drift layer 22 is higher than that of the single-crystal substrate 10 and is $1\times10^{10}$ cm$^{-3}$ to $1\times10^{17}$ cm$^{-3}$, for example.

The base region 23 is provided on the drift layer 22. A thickness of the base region 23 is smaller than that of the drift layer 22 and is 0.5 to 3 μm, for example. The base region 23, to which an acceptor is added, is a p-type. The acceptor is an Al (aluminum) atom, for example. An impurity concentration of the base region 23 is $1\times10^{17}$ cm$^{-3}$ to $1\times10^{19}$ cm$^{-3}$, for example.

The source region 24 is provided on the base region 23 with a thickness smaller than the base region 23. The source region 24 is thereby separated from the drift layer 22 by the base region 23. The source region 24, to which a donor is added, is an n-type. The donor is an N (Nitrogen) atom, for example. An impurity concentration of the source region 24 is $1\times10^{18}$ cm$^{-3}$ to $1\times10^{21}$ cm$^{-3}$, for example.

The base region 23 includes the channel region CH on a surface of the SiC layer 20. The channel region CH is a region in which an inversion layer is formed in the base region 23 in an on-state, and connects the drift layer 22 and the source region 24.

A resistance of the channel region CH (the channel resistance) in the on-state takes a minimum value at a temperature of not less than 100° C. and not more than 150° C., which will be described in detail hereinafter. It is preferable that, reflecting the temperature dependence of the channel resistance described above, a resistance between the source electrode 70 and the drain electrode 80 in the on-state (the on-resistance) also takes a minimum value at a temperature of not less than 100° C. and not more than 150° C.

The gate insulating film 50 is provide on the SiC layer 20 to cover the channel region CH of the base region 23. The gate insulating film 50 is mainly made of silicon oxide, for example. In the present embodiment, the gate insulating film 50 also covers part of the drift layer 22 and source region 24.

The channel region CH has an interface state density of not less than $1.7\times10^{12}$ eV$^{-1}$ cm$^{-2}$ and not more than $2.6\times10^{12}$ eV$^{-1}$ cm$^{-2}$ at an energy of 0.4 eV from a conduction band edge. The channel region CH has a plane orientation corresponding to a plane orientation of the main surface of the single-crystal substrate 10, that is to say, the (0001) plane.

The gate electrode 60 faces the channel region CH of the SiC layer 20 with the gate insulating film 50 therebetween. The gate electrode 60 is a polycrystalline silicon film having conductivity, for example.

The source electrode 70 is provided on the SiC layer 20 so as to be in contact with the source region 24 and separated from the drift layer 22. The interlayer insulating film 90 insulates the gate electrode 60 from the source electrode 70. A thickness of the interlayer insulating film 90 is 1 to 3 μm, for example. The drain electrode 80 is provided on a surface of the single-crystal substrate 10 being opposite to the surface on which the SiC layer 20 is formed. The epitaxial substrate made up of the single-crystal substrate 10 and the SiC layer 20 is therefore sandwiched between the drain electrode 80 and the source electrode 70. The source electrode 70 and the drain electrode 80 are made of an Al alloy, for example.

<Operation>

When a positive voltage larger than a threshold voltage is applied to the gate electrode 60, the inversion layer is formed in the channel region CH. That is to say, a path through which an electron as a carrier flows is formed between the n-type source region 24 and drift layer 22. The electron flowing from the source region 24 into the drift layer 22 reaches the drain electrode 80 via the drift layer 22 and the single-crystal substrate 10 in accordance with an electrical field formed by the positive voltage applied to the drain electrode 80. Accordingly, when the positive voltage is applied to the gate electrode 60, the current flows from the drain electrode 80 to the source electrode 70. This state is referred to as the on-state.

A resistance between the source electrode 70 and the drain electrode 80 in the on-state, that is to say, the on-resistance is equal to a sum of the channel resistance which is the resistance of the channel region CH and a drift resistance which is a resistance of the drift layer 22. The channel resistance is determined by a channel length which is a length of the channel region CH and an electron mobility in the channel region CH. The resistance of the channel region of the MOSFET 200 in the on-state takes the minimum value at the temperature of not less than 100° C. and not more than 150° C. as described above.

In contrast, when a voltage smaller than the threshold voltage is applied to the gate electrode 60, the inversion layer is not formed in the channel region CH, so that the current does not flow from the drain electrode 80 to the source electrode 70. This state is referred to as the off-state.

In the off-state, a depletion layer extends from a p-n junction between the drift layer 22 and the base region 23 due to the positive voltage applied to the drain electrode 80. When the depletion layer extending from the p-n junction toward the base region 23 reaches the source region 24, a breakdown caused by a punch-through may occur. Accordingly, it is preferable that the impurity concentration of the base region 23 is high enough to sufficiently suppress the extension of the depletion layer. In the meanwhile, when the excessively high impurity concentration is obtained, a deterioration in a crystal quality caused by an ion implantation for obtaining the high impurity concentration may become prominent. Accordingly, the impurity concentration of a bottom surface of the base region 23 is preferably not less than $1 \times 10^{17}$ cm$^{-3}$ and not more than $1 \times 10^{1}$ cm$^{-3}$.

<Manufacturing Method>

Next, a manufacturing method of the MOSFET 200 is described hereinafter using a flow chart of FIG. 2 and sectional views of FIGS. 3 to 9.

Figure 2:
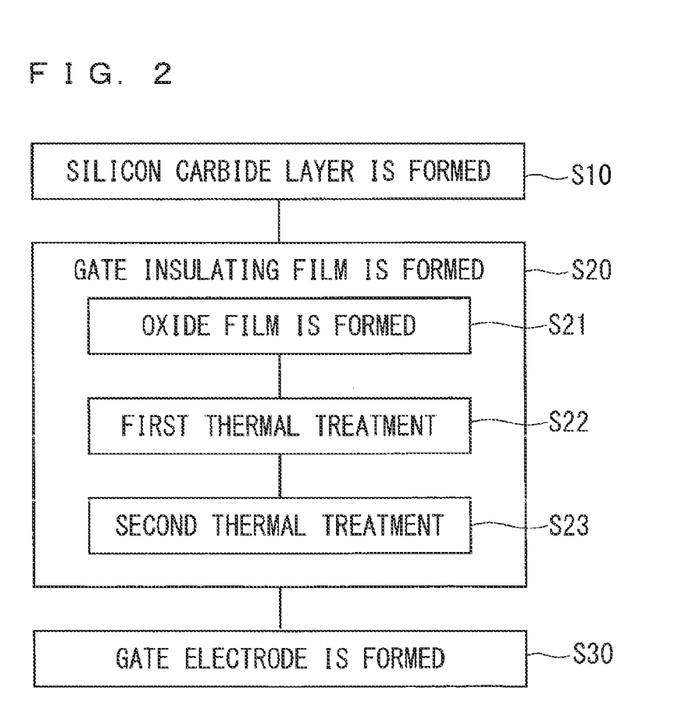
FIG. 2 A schematic flow chart of a manufacturing method of the silicon carbide semiconductor device in FIG. 1.
Figure 3:
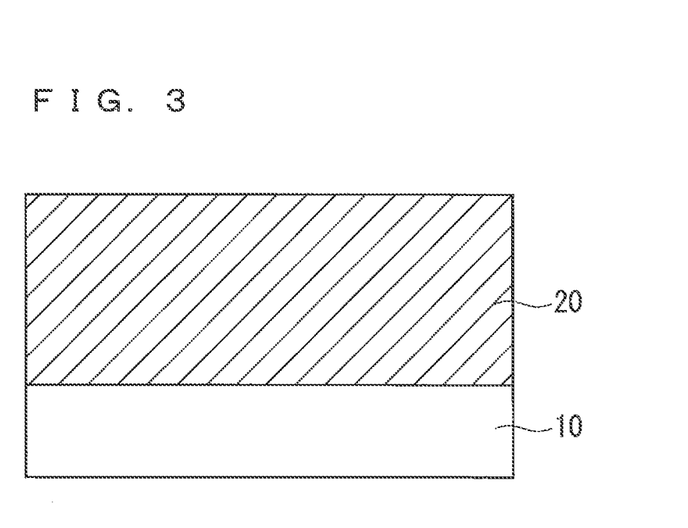
FIG. 3 A sectional view schematically showing a first step of the manufacturing method of the silicon carbide semiconductor device in FIG. 1.

With reference to FIG. 3, the SiC layer 20 is formed on the main surface of the single-crystal substrate 10 by an epitaxial growth (FIG. 2: a step S10). Chemical Vapor Deposition (CVD) method may be applied as a method of forming the SiC layer 20. As shown in FIG. 1, the SiC layer 20 includes a part used as the drift layer 22 as it is and a part which becomes the base region 23 and the source region 24 by the ion implantation described below. A conductivity type and impurity concentration of the SiC layer 20 right after being deposited is therefore similar to those of the drift layer 22. The SiC layer 20 includes the part which becomes the base region 23, so that it includes part which becomes the channel region CH (FIG. 1).

Figure 4:
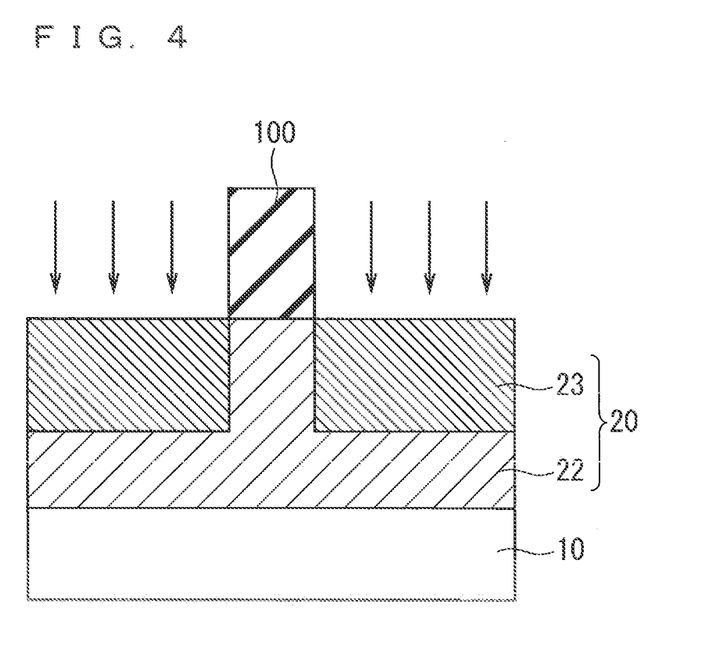
FIG. 4 A sectional view schematically showing a second step of the manufacturing method of the silicon carbide semiconductor device in FIG. 1.

Next, with reference to FIG. 4, am implantation mask 100 is formed on the surface of the SiC layer 20. Next, Al ions are implanted into the SiC layer 20 as an acceptor using the implantation mask 100. A part into which the Al ions are implanted becomes the base region 23, and a remaining part becomes the drift layer 22. Accordingly, the acceptor is implanted into the part which becomes the base region 23 at a higher concentration than a donor concentration of the drift layer 22. N ions may be implanted into a shallow region including the channel region CH (FIG. 1) to adjust the threshold voltage. Subsequently, the implantation mask 100 is removed.

Figure 5:
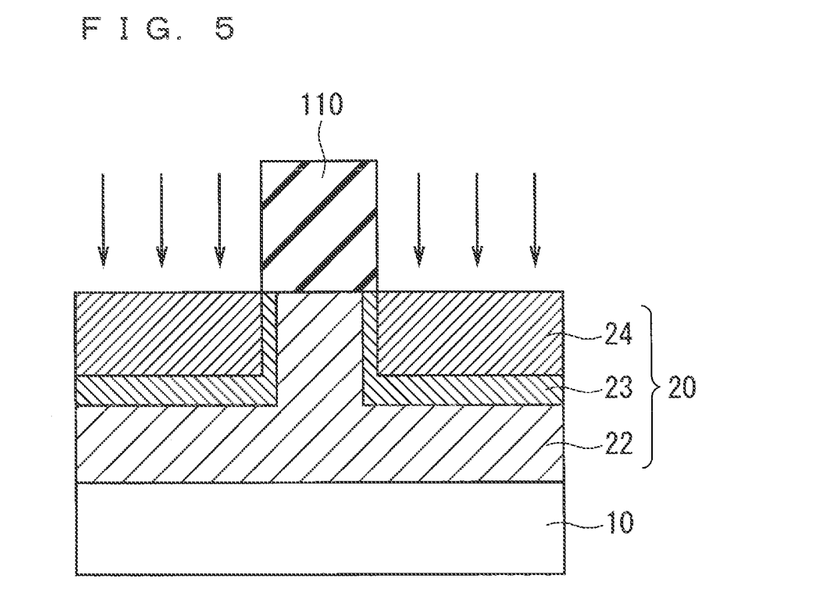
FIG. 5 A sectional view schematically showing a third step of the manufacturing method of the silicon carbide semiconductor device in FIG. 1.

Next, with reference to FIG. 5, an implantation mask 110 is formed on the surface of the SiC layer 20. Next, N ions are implanted into the SiC layer 20 as a donor using the implantation mask 110. A part into which the N ions are implanted becomes the source region 24. For the above purpose, the donor is implanted into the source region 24 at a higher concentration than an acceptor concentration of the base region 24. Subsequently, the implantation mask 110 is removed.

Next, a thermal treatment is performed, using a thermal treatment device, for 30 seconds to 1 hour at a temperature of 1300° C. to 1900° C. in an inert gas atmosphere such as an Ar (argon) gas. This thermal treatment activates the ions implanted in the steps in FIGS. 4 and 5. The steps in FIGS. 4 and 5 may be switched to each other.

Figure 6:
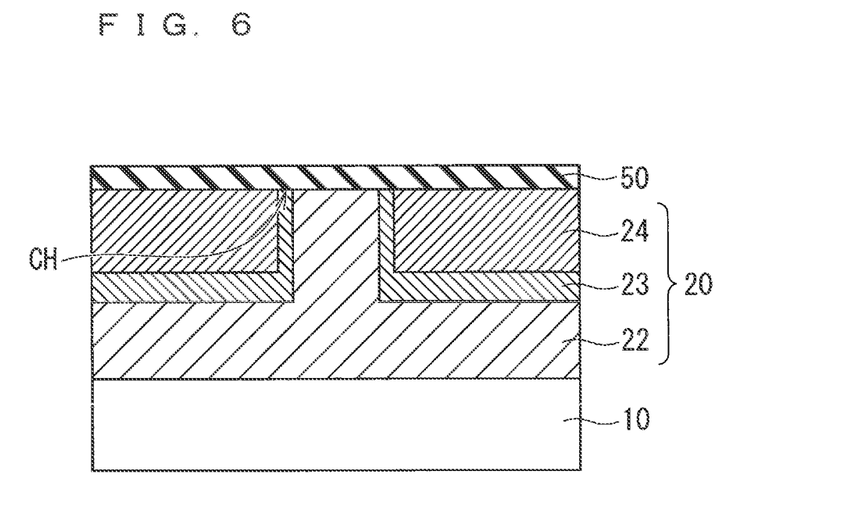
FIG. 6 A sectional view schematically showing a fourth step of the manufacturing method of the silicon carbide semiconductor device in FIG. 1.

Next, with reference to FIG. 6, the gate insulating film 50 covering the part which becomes the channel region CH (FIG. 1) is formed. (FIG. 2: a step S20). Specifically, the following steps are performed.

A thermal oxidation is performed on the surface of the SiC layer 20. Accordingly, an oxide film covering the part which becomes the channel region CH (FIG. 1) is formed (FIG. 2: a step S21).

Next, a first thermal treatment for reducing the interface state density of the channel region CH is performed in a nitriding atmosphere (FIG. 2: a step S22). A temperature of the first thermal treatment is 1150° C. to 1350° C., for example. An atmosphere including a nitric oxide gas such as NO or $N_2O$ or an $NH_3$ gas is used as the nitriding atmosphere. An atmosphere using a $POCl_3$ gas or an $H_2$ gas may also be used instead of the nitriding atmosphere.

Next, a second thermal treatment for increasing the interface state density of the channel region CH is performed in an oxidizing atmosphere (FIG. 2: a step S23). The channel region CH after this treatment has the interface state density of not less than $1.7 \times 10^{12}$ eV$^{-1}$ cm$^{-2}$ and not more than $2.6 \times 10^{12}$ eV$^{-1}$ cm$^{-2}$ at the energy of 0.4 eV from the conduction band edge. An increment of the interface state density can be controlled by a treatment temperature, a treatment time, or an atmosphere. Specifically, the second thermal treatment is performed at a temperature of not less than 800° C. and not more than 1000° C. In the present embodiment, the oxidizing atmosphere is a wet atmosphere. The wet atmosphere preferably includes a mixed gas of an $H_2$ gas and an $O_2$ gas. A flow ratio calculated by an $H_2$ gas flow volume/an $O_2$ gas flow volume used for forming the atmosphere is preferably not less than 0.5 and not more than 1.8.

The gate insulating film 50 is formed by the above steps.

Figure 7:
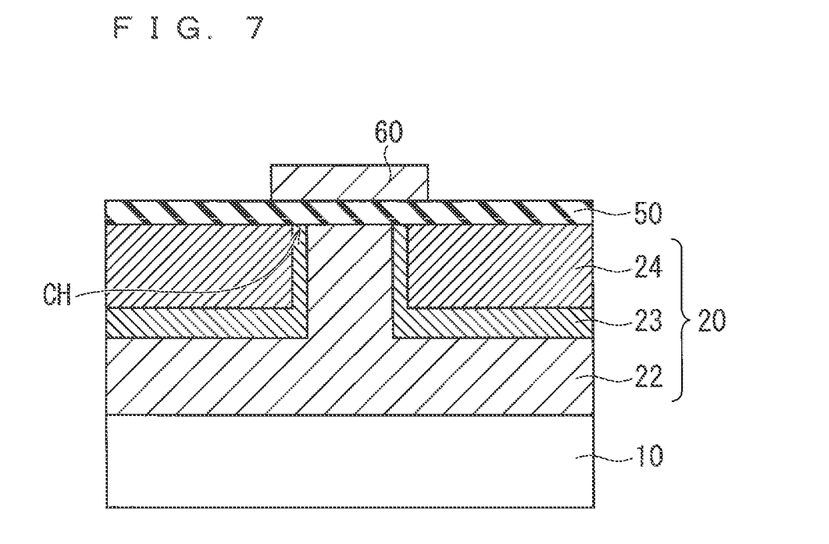
FIG. 7 A sectional view schematically showing a fifth step of the manufacturing method of the silicon carbide semiconductor device in FIG. 1.

Next, with reference to FIG. 7, the gate electrode 60 which faces the channel region CH of the SiC layer 20 with the gate insulating film 50 therebetween is formed (FIG. 2: a step S30). Specifically, a formation of a conductive polycrystalline silicon film by a low pressure CVD method and a patterning thereof are performed.

Figure 8:
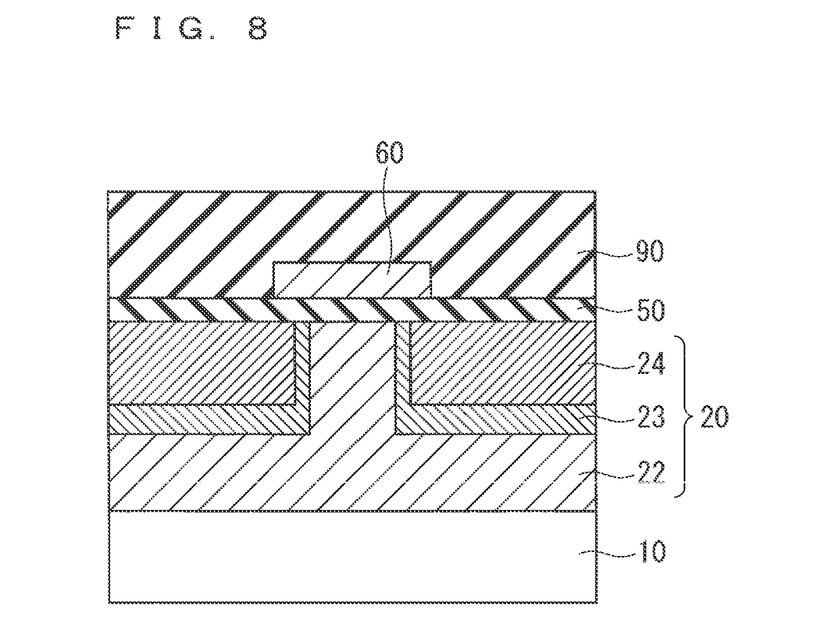
FIG. 8 A sectional view schematically showing a sixth step of the manufacturing method of the silicon carbide semiconductor device in FIG. 1.

Next, with reference to FIG. 8, the interlayer insulating film 90 covering the gate electrode 60 is formed. The CVD method, for example, may be used as the formation method.

Figure 9:
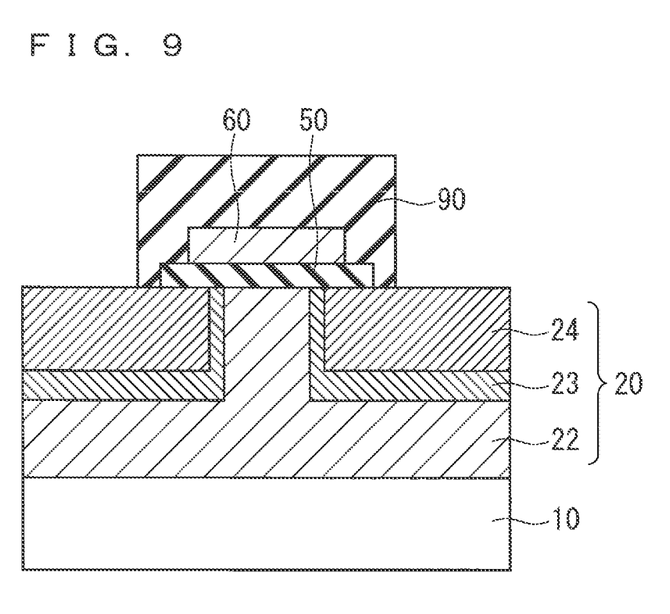
FIG. 9 A sectional view schematically showing a seventh step of the manufacturing method of the silicon carbide semiconductor device in FIG. 1.

Next, with reference to FIG. 9, an opening is formed in the interlayer insulating film 90 and the gate insulating film 50 by an etching using an etching mask (not shown). The source region 24 is thereby partially exposed.

With reference to FIG. 1 again, the source electrode 70 and the drain electrode 80 are formed. The MOSFET 200 is obtained by the above steps.

Embodiment

Each MOSFET of a comparison example A and working examples B and C was made using a separate wafer. A structure of sufficiently increasing a proportion of the channel resistance in the on-resistance was adopted to the above MOSFET so that a temperature dependence of the channel resistance can be approximately grasped by a temperature dependence of the on-resistance. To grasp the interface state density of the MOS structure included in the MOSFET, a MOS capacitor including the similar MOS structure was formed in each wafer at the same time.

The comparison example A was made without the second thermal treatment (FIG. 2: the step S23). The working example B was made using the second thermal treatment at 800° C. The working example C was made using the second thermal treatment at 900° C.

Figure 10:
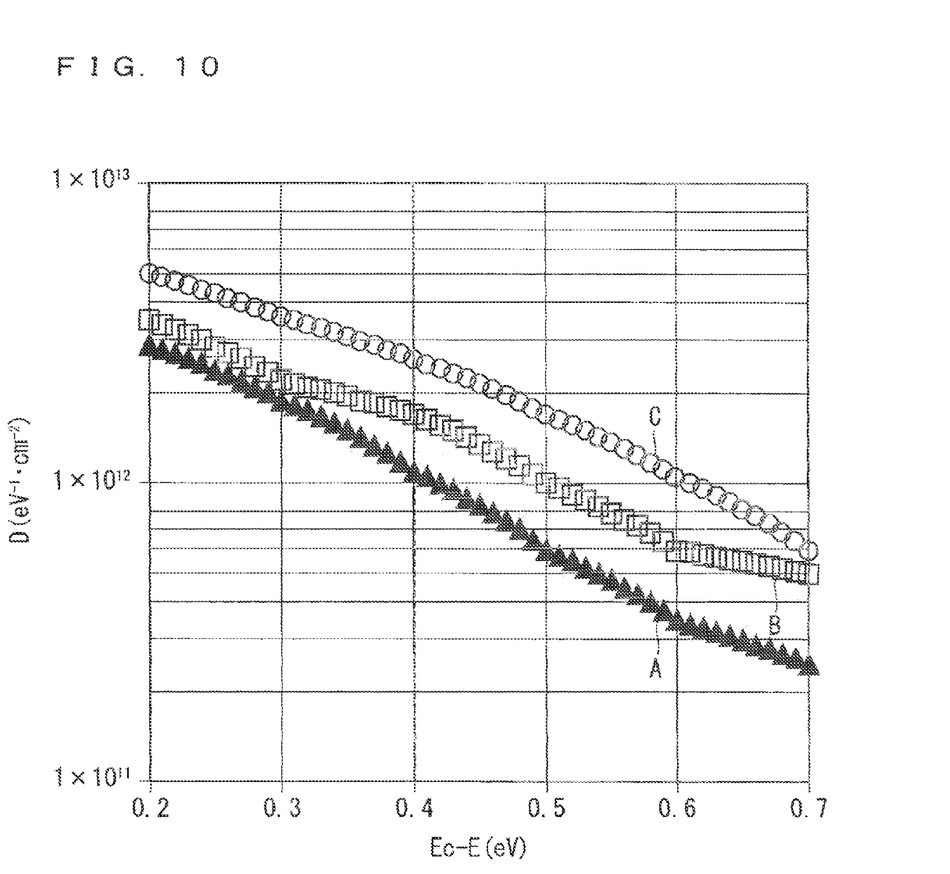
FIG. 10 A graph chart showing an energy dependence of an interface state density in a MOS capacitor in a working example and a comparison example of the embodiment 1.

FIG. 10 shows a measurement result of an energy dependence of an interface state density D in each of the comparison example A and the working examples B and C. A horizontal axis $E_c-E$ indicates an energy difference between an energy E of an interface state and an energy $E_c$ of a conduction band edge close to the energy E. The interface state density was derived from a DLTS (Deep Level Transient Spectroscopy) measurement (time constant τ=0.3 seconds). The interface state density in the MOS capacitors of the working examples B and C increased in a whole energy range which was measured, compared with the MOS capacitor of the comparison example A. It is considered that the increase in the interface state density was caused by a slight generation of oxidation at the interface between the SiC layer 20 and the gate insulating film 50.

Figure 11:
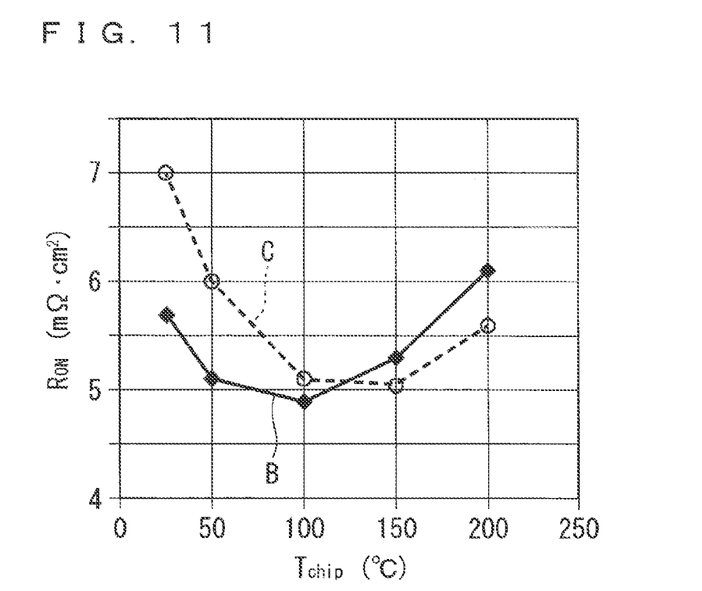
FIG. 11 A graph chart showing a temperature dependence of an on-resistance of the silicon carbide semiconductor device in the working example of the embodiment 1.

FIG. 11 shows a relationship between an on-resistance $R_{ON}$ in each MOSFET and a chip temperature $T_{CHIP}$ of each MOSFET in the working examples B and C. The on-resistance $R_{ON}$ took a minimum value at the chip temperature $T_{CHIP}$ of 100° C. in the working example B and 150° C. in the working example C. It is therefore considered that the channel resistance, which makes up a large portion of the on-resistance $R_{ON}$, also took the minimum value approximately at the temperature of 100° C. in the working example B and 150° C. in the working example C. In the comparison example A, the on-resistance $R_{ON}$ took a minimum value at the temperature of 25° C. (not shown in FIG. 11).

Figure 12:
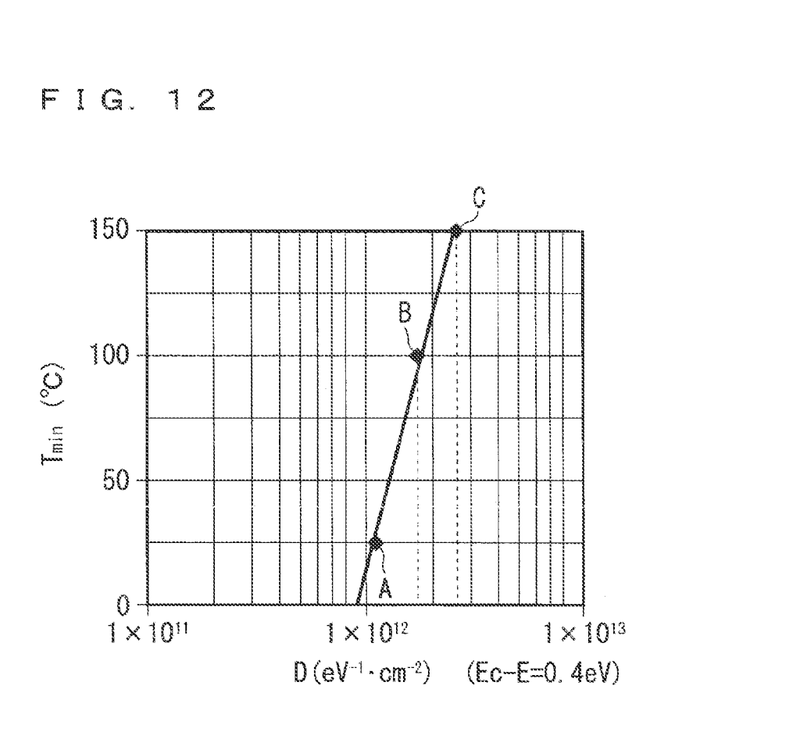
FIG. 12 A graph chart exemplifying a relationship between a temperature at which the on-resistance of the silicon carbide semiconductor device takes a minimum value and the interface state density in the corresponding MOS capacitor in the working example and the comparison example of the embodiment 1.

FIG. 12 is a graph of a relationship between a temperature $T_{min}$ at which the on-resistance $R_{ON}$ takes a minimum value and an interface state density D in a case of $E_C-E=0.4$ eV, using the result of FIG. 10 and FIG. 11. A specific value of the interface state density D at $E_C-E=0.4$ eV was $1.2\times10^{12}$ $eV^{-1}$ $cm^{-2}$ in the comparison example A, $1.7\times10^{12}$ $eV^{-1}$ $cm^{-2}$ in the working example B, and $2.6\times10^{12}$ $eV^{-1}$ $cm^{-2}$ in the working example C. A straight line in FIG. 12 is an approximate straight line depicted to easily grasp the relationship. As can be seen from the graph, the temperature $T_{min}$ and the interface state density D at $E_C-E=0.4$ eV had a high correlation with each other.

<Consideration>

As can be seen from the result of the on-resistance $R_{ON}$ in a case of the chip temperature $T_{CHIP}=25°$ C. (FIG. 11), the on-resistance $R_{ON}$ at the room temperature decreases as the interface state density D at the energy E which is close to the energy $E_c$ of the conduction band edge decreases. Accordingly, it is conventionally believed that the interface state density D needs to be decreased to obtain the MOSFET having the low on-resistance $R_{ON}$. However, the present inventor found that the channel resistance can be further decreased by the increase of the interface state density D in high temperature of 100° C. to 150° C., not in the room temperature. The configuration of the MOSFET 200 of the present embodiment has been conceived based on the above finding.

When the proportion of the channel resistance in the on-resistance is large in some extent, a temperature range in which the on-resistance takes the minimum value can be sufficiently controlled by controlling a temperature range in which the channel resistance takes the minimum value. For example, on an inverter which keeps operating at the temperature of 150° C., it is preferable to mount a MOSFET whose on-resistance $R_{ON}$ is low at the temperature of 150° C. even if whose on-resistance $R_{ON}$ is high at the room temperature as the working example C (FIG. 11).

It was difficult to stably make the MOSFET having the temperature $T_{min}$ higher than 150° C. by reason that it was hard to control the interface state density. For example, the MOSFET having the interface state density $D=4\times10^{12}$ $eV^{-1}$ $cm^{-2}$ at $E_C-E=0.4$ eV was obtained; however, the decrease in the on-resistance in a practical temperature range was not found. The reason for this result may be that the interface state density D was excessively large.

<Effect>

According to the MOSFET 200 of the present embodiment, the channel resistance takes the minimum value in the high temperature environment of not less than 100° C. and not more than 150° C., which is considered to be useful as an operation temperature. Accordingly, the on-resistance of the MOSFET 200 in which the channel resistance makes up the large portion can be decreased particularly in the high temperature environment. In the MOSFET having a rated voltage of 1700V or less, in particular, the drift resistance is small and the channel resistance therefore makes up the large portion of the on-resistance, so that the present embodiment enables the obtainment of the large effect of reducing the on-resistance in the high temperature environment.

The channel region CH of the SiC layer 20 has the interface state density of not less than $1.7\times10^{12}$ $eV^{-1}$ $cm^{-2}$ and not more than $2.6\times10^{12}$ $eV^{-1}$ $cm^{-2}$ at $E_C-E=0.4$ eV. Accordingly, the temperature dependence of taking the minimum value in the high temperature environment of not less than 100° C. and not more than 150° C. can be easily given to the channel resistance.

In the MOSFET 200, the on-resistance $R_{ON}$ is minimized at the temperature $T_{min}$ which is higher than the room temperature, so that the MOSFET 200 can easily and stably operate with the chip temperature $T_{CHIP}$ at the operation temperature near the temperature $T_{min}$. When the chip temperature $T_{CHIP}$ deviates from the operation temperature near the temperature $T_{min}$, an action that the chip temperature $T_{CHIP}$ returns to the temperature $T_{min}$ occurs. In particular, when the chip temperature $T_{CHIP}$ becomes lower than the operation temperature, the action that the chip temperature $T_{CHIP}$ returns to the temperature $T_{min}$ occurs due to a heat caused by applying current to the chip.

According to the method of manufacturing the MOSFET 200 of the present embodiment, the channel resistance is decreased by the decrease in the interface state density caused by the first thermal treatment, and moreover, the channel resistance is adjusted to take the minimum value in the high temperature environment by the second thermal treatment. Accordingly, the on-resistance, in which the channel resistance makes up the large portion, of the MOSFET 200 can be decreased particularly in the high temperature environment.

When the second thermal treatment is performed at the temperature of 800° C. or more, the interface state density can be effectively increased. When the second thermal treatment is performed at the temperature of 1000° C. or less, the interface state density can be controlled with a high degree of accuracy.

When the oxidizing atmosphere is the wet atmosphere, the on-resistance can be decreased in the high temperature environment more effectively.

The wet atmosphere includes the mixed gas of the $H_2$ gas and the $O_2$ gas. Accordingly, the interface state density can be controlled in accordance with a mixing ratio between the $H_2$ gas and the $O_2$ gas with a high degree of accuracy. In particular, when the flow ratio calculated by the $H_2$ gas flow volume/the $O_2$ gas flow volume is not less than 0.5 and not more than 1.8, the accuracy can be further enhanced.

<Modification Example>

The oxidizing atmosphere is not necessarily limited to the wet atmosphere, and may be an $O_2$ atmosphere, or an $N_2O$ atmosphere associated with an occurrence of an oxygen radical caused by a thermal decomposition. The interface state density of the channel region CH can also be increased in such an oxidizing atmosphere.

Figure 13:
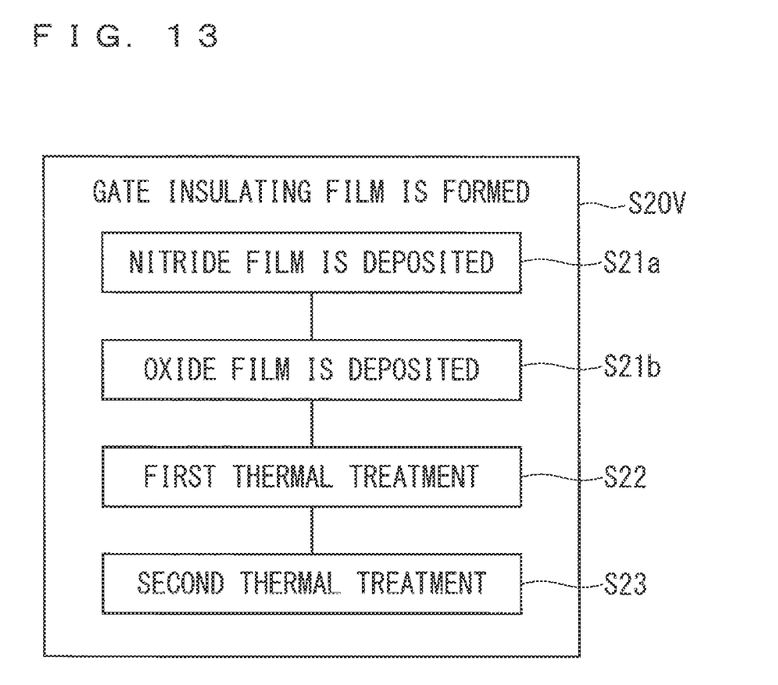
FIG. 13 A flow chart showing a modification example of steps of forming a gate insulating film in FIG. 2.

A step S20V (FIG. 13) may be performed instead of the step S20 (FIG. 2). In a step S20V, prior to a step of forming an oxide film (FIG. 13: a step S21b), a step of depositing a nitride film for covering the channel region CH (a step S21a) is performed. In the step S21b, the oxide film which covers the channel region CH with the above nitride film therebetween is deposited. The CVD method can be used as the method of depositing the nitride film and the oxide film. According to the present modification example, the interface state density can be controlled with a higher degree of accuracy.

Embodiment 2

In the MOSFET of the present embodiment, an added element having a concentration of $1\times10^{17}$ cm$^{-3}$ to $1\times10^{18}$ cm$^{-3}$ is added to the channel region CH (FIG. 1) in addition to the conductive impurity functioning as the donor or the acceptor.

The above added element may be a non-conductive impurity. That is to say, the added element may be an impurity atom different from the Si atom and the C atom, which constitute a base material, and may have non-conductivity. The non-conductive impurity may be at least one of a Se (selenium) atom and a Ge (germanium) atom. Although both a Se atom and a Ge atom may be added, the steps are simplified by adding one type of atom.

Alternatively, the above added element may be at least one of a Si atom and a C atom added as an interstitial atom of a SiC crystal in the SiC layer 20.

The above added element can be added by the ion implantation using the implantation mask 100 in the step shown in FIG. 4 in the embodiment 1.

In the present embodiment, the first and second thermal treatments described in detail in the embodiment 1 (FIG. 2 and FIG. 13: the steps S22 and S23) can be omitted for the simplification of the steps. However, it is preferable to perform the first thermal treatment for the purpose of obtaining the lower channel resistance.

Since the configuration other than those described above is almost the same as the configuration in the above embodiment 1, the same or corresponding elements are denoted by the same reference signs, which are not described repeatedly.

According to the present embodiment, the added element having the concentration of $1\times10^{17}$ cm$^{-3}$ to $1\times10^{18}$ cm$^{-3}$ is added to the channel region CH in addition to the conductive impurity. Accordingly, the interface state density in the desired range described in the embodiment 1 can be obtained by appropriately introducing the defect. The effect similar to the embodiment 1 can be thereby obtained.

When the added element is the non-conductive impurity, an influence of the addition of the added element on the acceptor concentration or the donor concentration can be avoided. When the non-conductive impurity is at least one of a Se atom and a Ge atom, the on-resistance can be decreased in the high temperature environment more effectively.

When the added element is a Si atom or a C atom, the interface state density can be decreased without adding the impurity to the base material of the SiC layer 20.

(Additional Remark)

Although the MOSFET is described in the above embodiments, the silicon carbide semiconductor device is not limited to the MOSFET. Any configuration may be adopted to the silicon carbide semiconductor device as long as it can switch between the on-state and the off-state by controlling the channel region with the application of the gate voltage, so that the silicon carbide semiconductor device may also be an IGBT, for example. A super-junction structure may be adopted to the silicon carbide semiconductor device. The gate structure is not limited to the planar type, and may be the trench type.

Although the silicon carbide semiconductor device having an n-channel is described in the above embodiment, the conductivity type of the channel is not limited to the n-channel but a p-channel may also be adopted. Each conductivity type of the semiconductor regions should be reversed to obtain the p-channel.

The plane orientation of the channel region is not limited to the (0001) plane but the other plane orientation such as (000-1), (11-20), and (0338), for example, may be adopted. Particularly, the channel resistance of the (11-20) plane contributes largely to the on-resistance, so that when the channel resistance is decreased, the on-resistance can be significantly decreased in the similar manner to the present embodiment. The channel having the (11-20) plane may be provided on a side wall of the trench formed on the (0001) plane or the (000-1) plane.

The polytype of the channel region is not limited to 4H but may be optionally selected, and, for example, a polytype 3C.

The above embodiments of the present invention can be appropriately modified, omitted, or freely combined within the scope of the invention. The present invention has been shown and described in detail; the foregoing description is in all aspects illustrative and not restrictive. It is therefore understood that numerous modifications and variations can be devised without departing from the scope of the invention.

REFERENCE SIGNS LIST

CH: channel region, 10: single-crystal substrate, 20 SiC layer (silicon carbide layer), 22: drift layer, 23: base region, 24: source region, 50: gate insulating film, 60: gate electrode, 70: source electrode, 80: drain electrode, 90: interlayer insulating film, 100, 110: implantation mask, 200: MOSFET (silicon carbide semiconductor device).

The invention claimed is:

1. A silicon carbide semiconductor device capable of switching between an on-state and an off-state by controlling a channel region with an application of a gate voltage, comprising: a silicon carbide layer including said channel region; a gate insulating film covering said channel region of said silicon carbide layer; and a gate electrode facing said channel region of said silicon carbide layer with said gate insulating film therebetween, wherein a resistance of said channel region in said on-state takes a minimum value at a temperature of not less than 100° C. and not more than 150° C.; wherein said channel region of said silicon carbide layer has an interface state density of not less than $1.7 \times 10^{12}$ $eV^{-1}$ $cm^{-2}$ and not more than $2.6 \times 10^{12}$ $eV^{-1}$ $cm^{-2}$ at an energy of 0.4 eV from a conduction band edge.

2. The silicon carbide semiconductor device according to claim 1, wherein
   in addition to a conductive impurity, an added element is added to said channel region.

3. The silicon carbide semiconductor device according to claim 2, wherein
   said added element is a non-conductive impurity.

4. The silicon carbide semiconductor device according to claim 3, wherein
   said non-conductive impurity is at least one of a Se atom and a Ge atom.

5. The silicon carbide semiconductor device according to claim 2, wherein
   said added element is at least one of a Si atom and a C atom added as an interstitial atom of a SiC crystal.

6. The silicon carbide semiconductor device according to claim 2, wherein
   said added element having a concentration of $1 \times 10^{17}$ $cm^{-3}$ to $1 \times 10^{18}$ $cm^{-3}$ is added to said channel region.

* * * * *